United States Patent
Liu et al.

(10) Patent No.: US 7,405,467 B2
(45) Date of Patent: Jul. 29, 2008

(54) POWER MODULE PACKAGE STRUCTURE

(75) Inventors: Chun-Tiao Liu, Hsinchu (TW);
Da-Jung Chen, Taoyuan (TW);
Chun-Liang Lin, Tainan (TW);
Jeng-Jen Li, Taipei (TW); Cheng Chieh Hsu, Hsinchu (TW); Chau Chun Wen, Taoyuan (TW)

(73) Assignee: Cyntec Co., Ltd., Hsin-Chu (TW)

( * ) Notice: Subject to any disclaimer, the term of this patent is extended or adjusted under 35 U.S.C. 154(b) by 138 days.

(21) Appl. No.: 11/233,578

(22) Filed: Sep. 22, 2005

(65) Prior Publication Data

US 2006/0267187 A1    Nov. 30, 2006

(30) Foreign Application Priority Data

May 25, 2005   (TW)   ............................... 94117109 A

(51) Int. Cl.
*H01L 23/495*   (2006.01)
*H01L 21/00*   (2006.01)
*H01R 9/00*   (2006.01)
*H01R 43/00*   (2006.01)

(52) U.S. Cl. .................. 257/672; 257/692; 257/724; 257/784; 257/E23.031; 257/E23.043; 361/772; 361/813; 29/827; 29/830; 438/123

(58) Field of Classification Search ............... None
See application file for complete search history.

(56) References Cited

U.S. PATENT DOCUMENTS

| 5,083,189 | A  | * | 1/1992  | Sawaya ..................... 257/791 |
| 5,703,399 | A  | * | 12/1997 | Majumdar et al. ......... 257/723 |
| 5,767,573 | A  | * | 6/1998  | Noda et al. ................ 257/675 |
| 6,291,880 | B1 | * | 9/2001  | Ogawa et al. .............. 257/723 |
| 6,313,520 | B1 | * | 11/2001 | Yoshida et al. ............. 257/676 |
| 6,432,750 | B2 | * | 8/2002  | Jeon et al. .................. 438/122 |
| 6,775,145 | B1 |   | 8/2004  | Chen et al. |
| 6,975,513 | B2 | * | 12/2005 | Chen et al. ................. 361/719 |
| 7,061,080 | B2 | * | 6/2006  | Jeun et al. .................. 257/676 |

FOREIGN PATENT DOCUMENTS

KR    2002-0071585    9/2002

* cited by examiner

*Primary Examiner*—Alonzo Chambliss
(74) *Attorney, Agent, or Firm*—Birch, Stewart, Kolasch & Birch, LLP

(57) ABSTRACT

A power module package structure is disclosed. The control circuits are fabricated on a circuit plate, instead of fabricating them directly on a main substrate. The fabrication cost is reduced because the size of the substrate is shrunk. Furthermore, the power chips are placed on a material with high thermal conductivity. The heat produced from the power chips can be transmitted quickly. Thus, the reliability of the power module package can be improved.

25 Claims, 4 Drawing Sheets

POWER MODULE PACKAGE STRUCTURE

BACKGROUND OF THE INVENTION

1. Field of the Invention

The present invention generally relates to a kind of power module package structure. In particular, the present invention relates to a kind of power module package with characteristics of high heat dispersion efficiency and high integration.

2. Brief Description of the Prior Art

Increasing device complexity but shrinking size is common trend of the electrical product. Therefore, in addition to the shrinking size of the electrical product, how to put the most of electrical elements and wire bonds into the semiconductor package of the electrical product is very important. However, lots of heat is produced by the package structure with the high integration of electrical elements and wire bonds, when the electrical products are working. Especially for the power module, the heat affects the life and performance of the electrical product. Therefore, it is an important subject to improve the heat dispersion of the package structure with high integration of electrical elements and wire bonds.

Referring to FIG. 1, it is a cross-sectional diagram illustrating a conventional package structure of a power module. The package structure includes a high thermal conduction substrate 100, which is made of a high polymer isolating layer and an aluminum foil layer. All circuits of the package structure (not shown in the diagram) are fabricated on the substrate 100. The power element 110a, the control element 110b and other elements 110c are disposed on the substrate 100. A lead frame 121, 122 is suspended above the substrate 100 and several wire bonds 111, 112, 113 are formed to electrically connect the elements 110a, 110b, 110c and the circuits on the substrate 100. Then the elements and the circuits on the substrate 100 are encapsulated by package material, like resin, or molding but not the leads of lead frame 121, 122. The advantages of this power module package structure are simple and easy to manufacture. In this power module package structure, all elements 110a, 110b, 110c and all circuit are disposed on the substrate 100, and therefore the density of the circuits can not to be increased. So this package structure needs a bigger substrate, and it's cost is higher because it's bigger substrate. The heat which is produced by the power element 110a is transmitted to the heat sink through the substrate. And the heat is transmitted from the power element to the substrate by the adhesive between the substrate and the power element. Therefore, even the substrate is made of a high thermal conduction material but the large number of the heat can be transpired immediately.

Referring to FIG. 2, it is a cross-sectional diagram illustrating another conventional package structure of a power module. The power module package structure is similar to the package structure illustrated in FIG. 1. The structure also includes a high thermal conduction substrate 100, which is made of a high polymer isolating layer and an aluminum foil layer, with all circuits on it. The power element 110a, the control element 110b and other elements 110c are also disposed on the substrate 100. A lead frame 121, 122 is also suspended above the substrate 100 and several wire bonds 111, 112, 113 are also formed to electrically connect the elements 110a, 110b, 110c and the circuits on the substrate 100. And the elements and the circuits on the substrate 100 are also encapsulated by package material, like resin, or molding but not the leads of lead frame 121, 122. The difference between the package structure illustrated in FIG. 1 and FIG. 2 is that there is a metal plate 200 connected to the rear of the substrate 100 in the structure illustrated in FIG. 2. The advantages of this power module package structure are simple and easy to manufacture. And another advantage is that lots of heat can be immediately transmit by the metal plate 200 because it's high thermal conduction. Although there are many advantages of this package structure in FIG. 2, but the density of the circuits still can not be increased because all circuits are fabricated on the substrate 100. So the cost of the power module package still can be reduced.

Referring to FIG. 3, it is a cross-sectional diagram illustrating yet another conventional package structure of a power module. The package structure also includes a high thermal conduction substrate 100 which is made of a high polymer isolating layer and an aluminum foil layer. But the package structure in FIG. 3 is different from the package structure in FIG. 1 and in FIG. 2. In the power module illustrated in FIG. 3, all of the power element 110a and control element 110b are disposed on the lead frame by soldering or other method. The lead frame 121 and 122 are suspended above the substrate 100 but separated to each other without connecting. There are several wire bonds 111, 112 and etc. formed by wire bonding to electrically connect the elements 110a, 110b, lead frame 121, 122 and the circuits on it. And the elements and the circuits on the substrate 100 are encapsulated by package material, like resin, or molding but not the leads of lead frame 121, 122. The advantages of the power module package structure illustrated are simple and easy to manufacture. The density and accuracy of the circuits and package structure are limited because the circuits are fabricated on the lead frame. The heat produced by the power element 110a in power module is transmitted from the lead frame to substrate 110 through the packaging material. But the heat is not transmitted very well. It is because the heat is still transmitted from substrate to heat sink through the adhesive, and the adhesive is not a good thermal conductor.

Therefore, it is an important subject that how to improve the density of the package structure and to cost down. And it is another subject that how to solve the question of bad thermal conduction caused by the power element and the package structure with high density.

SUMMARY OF THE INVENTION

In view of foregoing mentioned problems, one object of the present invention is to provide a power module package structure with a stacking structure and a good path for heat transmitting. The stacking structure is formed by stacking the circuit plate on the lead frame. And all circuits in the power module package structure are fabricated on the circuit plate. Therefore, the package structure improves the heat transmitting and the density of the circuits caused by the package structure in prior art.

Another object of the present invention is to provide a power module package structure with a circuit plate on which all circuit are fabricated thereon instead of on the substrate, as well as a stacking structure for increasing the density of the circuits and shrinking the size of the package. And the stacking structure is formed by stacking the circuit plate on part of the lead frame. Therefore, the size of the substrate is shrunk and the cost is reduced.

Yet another object of the present invention is to provide a power module package structure in which the power elements are disposed on a high thermal conduction material on the substrate or disposed on a high thermal conduction substrate directly. The heat produced by the power elements is transmitted from high thermal conduction material to outside through the substrate, but not the package material with low thermal conduction. So the rate of thermal conduction of this power module package structure is better than the rate of thermal conduction of the conventional power module package structure. The power module package structure can bear the passing of the heat produced by the passing of lots of electric currents in short time because its high rate of thermal conduction. So the power module will not be broken down by the heat.

Accordingly, one embodiment of the present invention provides a power module package structure with high density and high thermal condition. The package structure comprises a substrate with high thermal condition, and a lead frame is disposed on topside of the substrate. A circuit plate with all circuits of the power module is disposed on the part of the lead frame to form a stacking structure. There are one or several control elements disposed on the circuit plate. And several power elements are disposed on the high thermal conduction material like lead frame or metal block on the substrate, or are directly disposed on the substrate with high thermal conduction. There is a good heat transmitting path to be formed by both of the two ways. And several wire bonds are formed to connect to the circuit plate and the lead frame, the circuit plate and the power elements, the power elements and the lead frame. Part of the substrate, all elements, lead frame and circuit plate are encapsulated by a package material.

According to foregoing package structure, the size of the substrate become smaller because the circuits are fabricated on the circuit plate in stead of on the substrate, and the stacking structure formed by the lead frame and the substrate. By this way, the size of the package structure can be shrunk effectively. The power elements are disposed on the high thermal conduction substrate or on the high thermal material on substrate to form a good thermal condition path. Therefore, the heat produced by the power elements is transmitted to outside or heat sink effectively and quickly.

Further scope of the applicability of the present invention, will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the following detailed description and the accompanying drawings, which are given by way of illustration only, and thus are not limitative of the present invention, and wherein.

BRIEF DESCRIPTION OF THE PREFERRED EMBODIMENT

Figure 1:
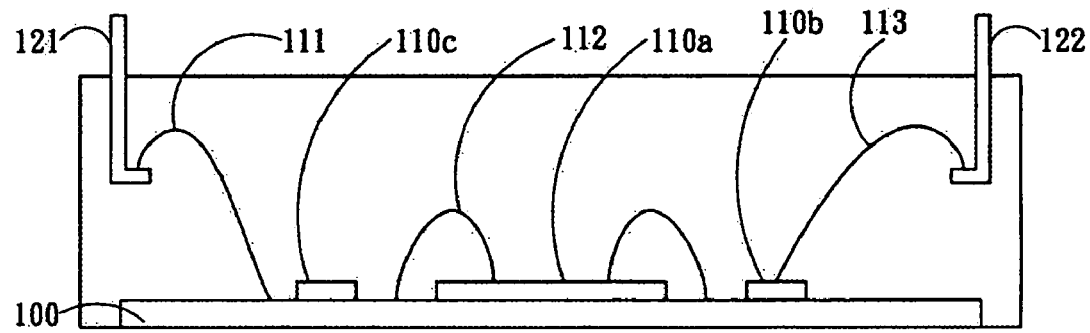
FIG. 1 to FIG. 3 are cross-sectional diagrams illustrating three kinds of conventional power module package structures.
Figure 2:
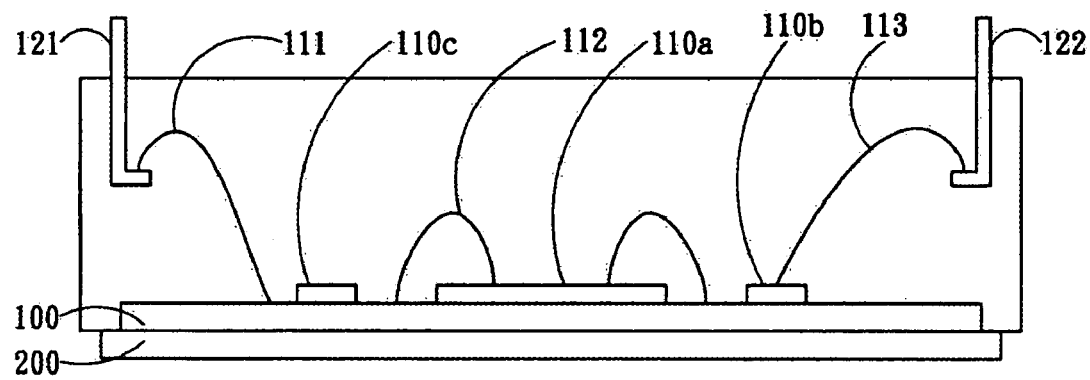
Figure 3:
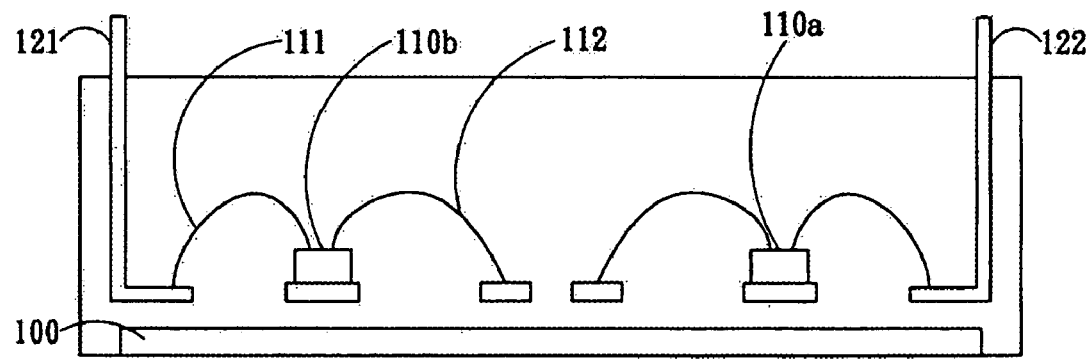
Figure 4A:
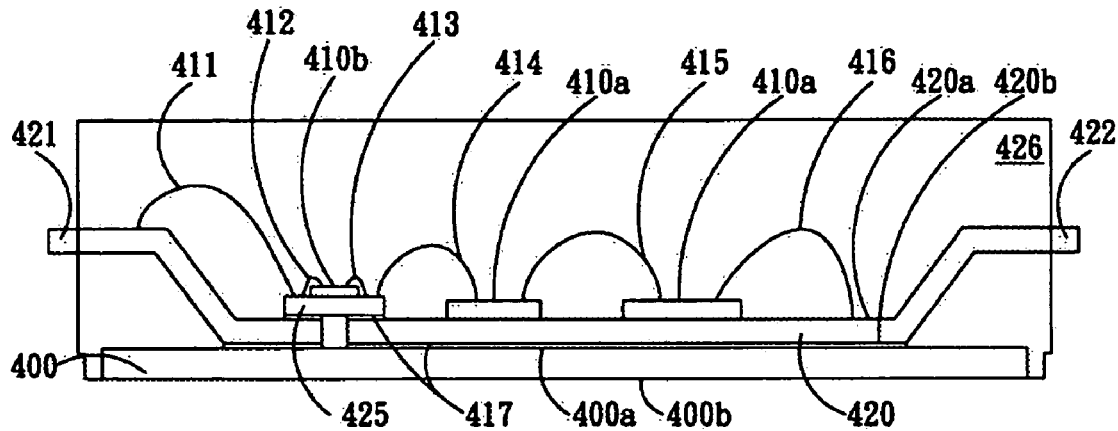
FIG. 4A to FIG. 4B are cross-sectional diagrams illustrating a power module package structure in which circuit plate and all elements are disposed on the lead frame in accordance with another embodiment of the present invention.

Referring to FIG. 4A, it is a cross-sectional diagram illustrating a power module package structure in accordance with one embodiment of the present invention. The package structure includes a substrate 400 with high thermal conduction and good isolation. There are a topside 400a and a backside 400b opposite to the topside 400a on the substrate 400. A lead frame 420 with several leads 421, 422 and etc. (not shown in the diagram) is disposed on the topside 400a of the substrate 400 by the second side 420b of the lead frame. A circuit plate 425 is disposed on the first side 420a of the lead frame 420 by connecting two of the ends of the circuit plate 425 with the first side 420a. A stacking structure is formed on the substrate 400 by this connecting. Therefore, the size of the substrate for package is effectively shrunk by this stacking structure. And the size of the package structure is also effectively shrunk by this stacking structure. Furthermore, one or a plurality of the second element 410b is disposed on the circuit plate 425, and a plurality of first elements 410a are disposed on the first side 420a of the lead frame 420. A plurality of wire bonds 411, 412, 413, 414, 415, 416 are formed in order to connect each elements 410a, 410b and the circuits of the circuit plate 425 and the lead frame 420 by wire bonding. Then part of the substrate, the elements, the circuit plate and lead frame are encapsulated by package material 426.

In the foregoing package structure, all circuits are fabricated on the circuit plate 425 instead of on the substrate 400, and a stacking structure is formed by the way of stacking the lead frame 420 and the circuit plate 425. The occupied area of the substrate is shrunk by the stacking structure. So the size of the package structure is shrunk, too. And the substrate 400 of the present invention is an isolating material, for example a ceramic material, a metal-composite material, a single surface metal-composite material or a dual surface metal-composite material. The circuit plate of the present invention is also an isolating material, for example a glass fiber epoxy or a ceramic material.

In the embodiment of the present invention, an adhesive material 417, for example sliver epoxy, is be used to connect the circuit plate 425 with the lead frame 420 and the substrate 400 in order to form a stacking structure. In the other embodiments of the present invention, the circuit plate 425 can be directly connected with the lead frame 420 and the substrate 400 for forming a stacking structure by soldering.

Figure 4B:
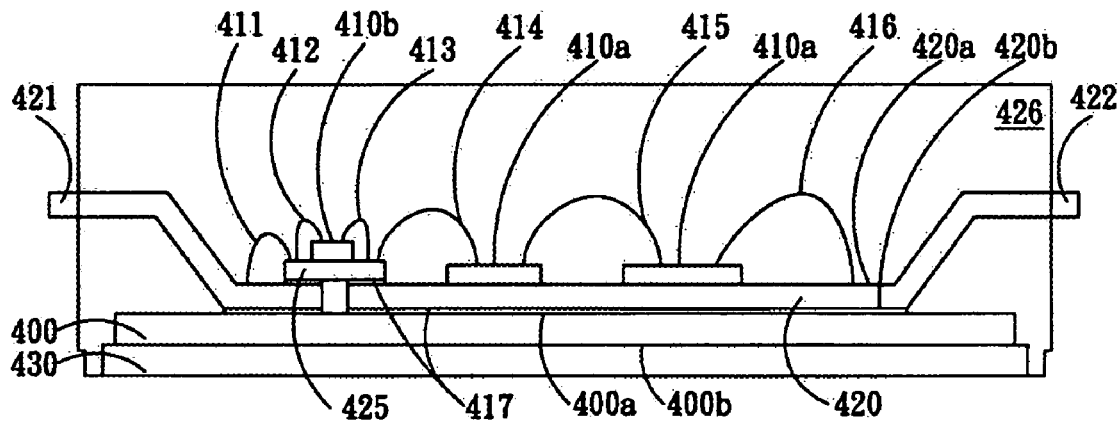

The first element 410a disclosed in the present invention is a power element which produces lots of heat when the power module is working. The power elements 410a are disposed on the lead frame 420 in order to form a good way to transmit heat. Therefore, the heat is transmitted to the substrate 400 and the outside heat sink quickly. Furthermore, a metal plate 430 is disposed on the backside 410b of the substrate 400, like the structure illustrated in FIG. 4B, for improving the rate and the ability of heat transmitting. The second element 410b is a control element which is used to control the power elements 410a. The control element 410b is disposed on the circuit plate 425, and is connected with the circuits on the circuit plate 425 by wire bonding. And the control element 410*b* is electrically connected with the power elements 410*a* by the wire bonds for controlling the power elements 410*a*.

Although in this embodiment, the two ends of the lead frame 420 turn upward, but not limit. The two ends of the lead frame can be on the same plane or respectively on different plane. Varity of structures of the lead frames are disclosed in following embodiments, but not limit. In the spirit of the present invention, the structure of the lead frame can be modified by the people who is familiar with this technique.

Figure 5A:
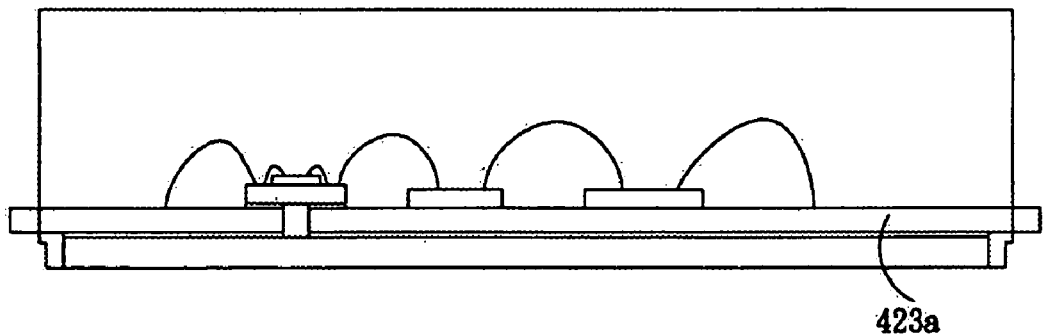
FIG. 5A to FIG. 5C are cross-sectional diagrams illustrating a power module package structure with many kinds of the lead frame in accordance with another embodiment of the present invention.
Figure 5B:
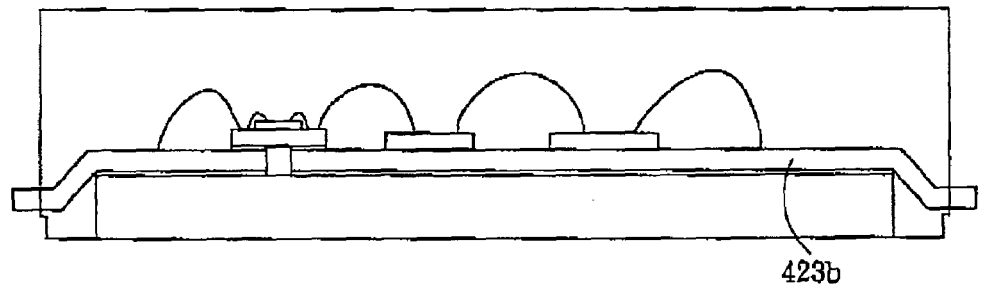
Figure 5C:
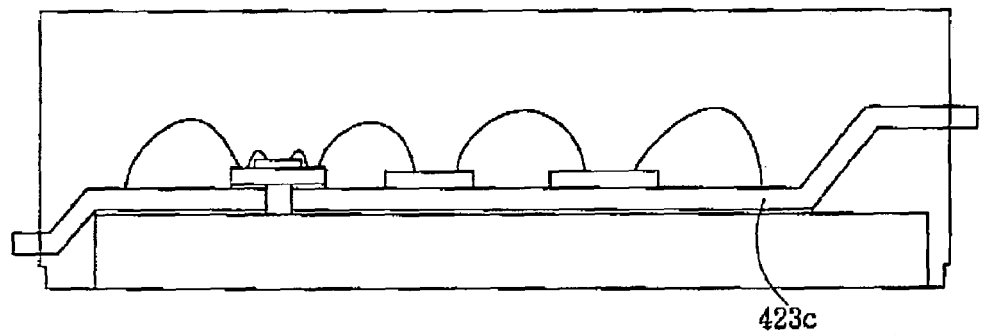

Referring to the FIG. 5A is a cross-sectional diagram illustrating a power module package structure in accordance with another embodiment of the present invention. The package structure illustrated in FIG. 5A is similar to the package structure illustrated in FIG. 4A. The difference between the two package structures illustrated in FIG. 5A and FIG. 4A is the structure of lead frame. In FIG. 5A all the ends of the lead frame 423*a* are on the same plane without sloping upward or down. In other words, they are straight. In the package structure illustrated in FIG. 5B is similar to the package structure illustrated in FIG. 4A, and the ends of lead frame 423*b* can be on different plane. The ends of lead frame 423*b* illustrated in FIG. 5B is sloped downward and is different from the lead frame with sloping upward ends illustrated in FIG. 4A. OR as illustrated in FIG. 5C, the ends of the lead frame 423*c* are on different plane and one of ends is sloped upward and the others is sloped downward. Furthermore, there are much variation of the structure of the lead frame can be used in the present invention with the spirit of the present invention.

Figure 6:
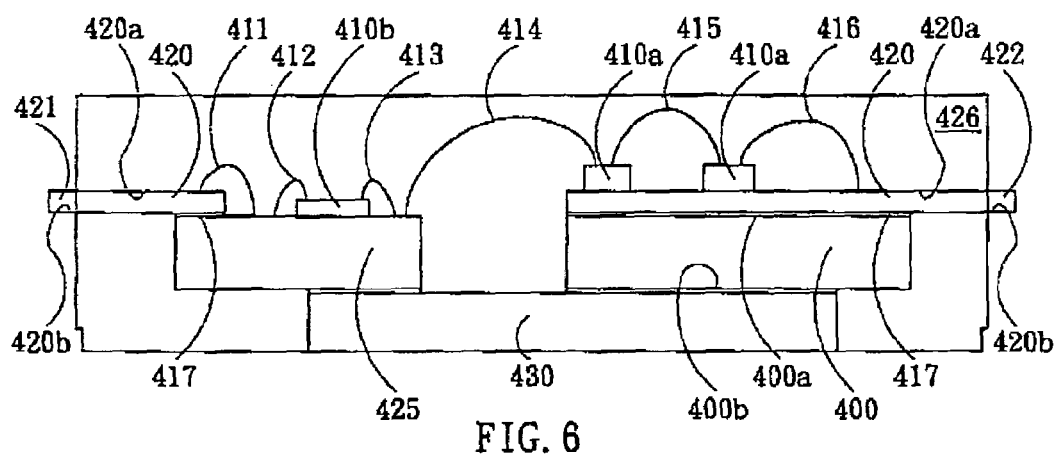
FIG. 6 is a cross-sectional diagram illustrating a power module package structure in which lead frame is disposed on the circuit plate in accordance with another embodiment of the present invention.

Referring to the FIG. 6, it is a cross-sectional diagram illustrating a power module package structure in accordance with another embodiment of the present invention. The package structure includes a lead frame 420 having a first surface 420*a*, a second surface 420*b* opposite to the first surface and a plurality of leads 421, 422 and etc. (not shown in the diagram); a substrate 400 with high thermal conduction and good isolation having a topside 400*a* and a backside 400*b* opposite to the topside 400*a* on the substrate 400, and a circuit plate 425. Part of the lead frame 420 is disposed on the circuit plate 425 in order to form a stacking structure by connecting the second surface 420*b* and the surface of circuit plate 425. The other part of the lead frame is disposed on the substrate 400 by connecting the second surface 420*b* with the topside 400*a* of the substrate 400. The stacking structure comprising the lead frame 420 and the circuit plate 425 is disposed on a metal plate. And the substrate 400 is disposed on the metal plate 430 by the connecting of the backside 400*b* and the metal plate 430. One or a plurality of second elements 410*b* is disposed on the circuit plate 425, and a plurality of first elements 410*a* are disposed on the circuit plate 425 respectively. The first elements are power elements, and the second elements are control elements. A plurality of wire bonds 411, 412, 413, 414, 415, 416 are formed in order to connect each elements 410*a*, 410*b* and the circuits of the circuit plate 425 and the lead frame 420 by wire bonding. Then part of the substrate, the elements, the circuit plate and lead frame are encapsulated by package material 426, but not the leads.

In foregoing package structure, all circuits are fabricated on the circuit plate 425 instead of on the substrate 400, and a stacking structure is formed by stacking the lead frame 420 and the substrate 400. The occupied area of the substrate is shrunk by the stacking structure. So the size of the package structure is shrunk, too. The power elements 410*a* are disposed on the lead frame 420 and the heat is transmitted from the lead frame 420 through the substrate 400 and the metal plate 430 to outside environment or the heat sink quickly because of the high thermal conduction of the lead frame 420. Furthermore, the ends of the lead frame 420 can be on the same plane or on different plane like the structure of lead frame 420 illustrated in FIG. 5A to FIG. 5C.

Figure 7:
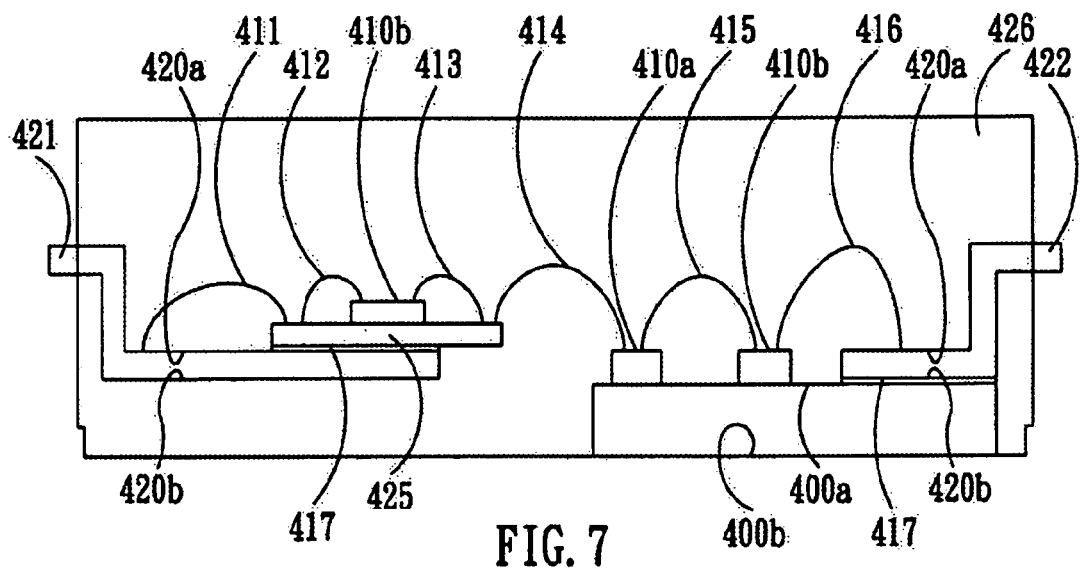
FIG. 7 is a cross-sectional diagram illustrating a power module package structure in which power elements are disposed on the substrate in accordance with another embodiment of the present invention.

Referring to the FIG. 7, it is a cross-sectional diagram illustrating a power module package structure in accordance with another embodiment of the present invention. The package structure includes a lead frame 420 having a first surface 420*a*, a second surface 420*b* opposite to the first surface and a plurality of leads 421, 422 and etc. (not shown in the diagram), and a circuit plate 425 is disposed on part of the first surface 420*a* of the lead frame 420 to form a stacking structure. In another embodiment, the stacking stricture is formed by the way of connecting the circuit plate 425 and part of the second surface 420*b* of the lead frame 420. A substrate 400 with high thermal conduction and good isolation having a topside 400*a* and a backside 400*b* opposite to the topside 400*a* on the substrate 400. Part of the lead frame 420 is disposed on the substrate 400 by connecting the second surface 420*b* of the lead frame 420 and the topside 400*a* of the substrate 400. One or a plurality of second elements 410*b* is disposed on the circuit plate 425, and a plurality of first elements 410*a* are disposed on the circuit plate 425 respectively. The first elements are power elements, and the second elements are control elements. A plurality of wire bonds 411, 412, 413, 414, 415, 416 are formed to connect each elements 410*a*, 410*b* and the circuits of the circuit plate 425 and the lead frame 420 by wire bonding. Then part of the substrate, the elements, the circuit plate and lead frame are encapsulated by package material 426, but not the leads.

In this embodiment, all circuits are fabricated on the circuit plate 425 instead of on the substrate 400, and a stacking structure is formed by stacking the lead frame 420 and the substrate 400. The occupied area of the substrate is shrunk by the stacking structure. So the size of the package structure is shrunk, too. The power elements 410*a* are directly disposed on the substrate 400 and the heat is transmitted from the substrate 400 to outside environment or the heat sink quickly because of the high thermal conduction of the substrate 400. Furthermore, the ends of the lead frame 420 can be on the same plane or on different plane like the structure of lead frame 420 illustrated in FIG. 5A to FIG. 5C.

Figure 8:
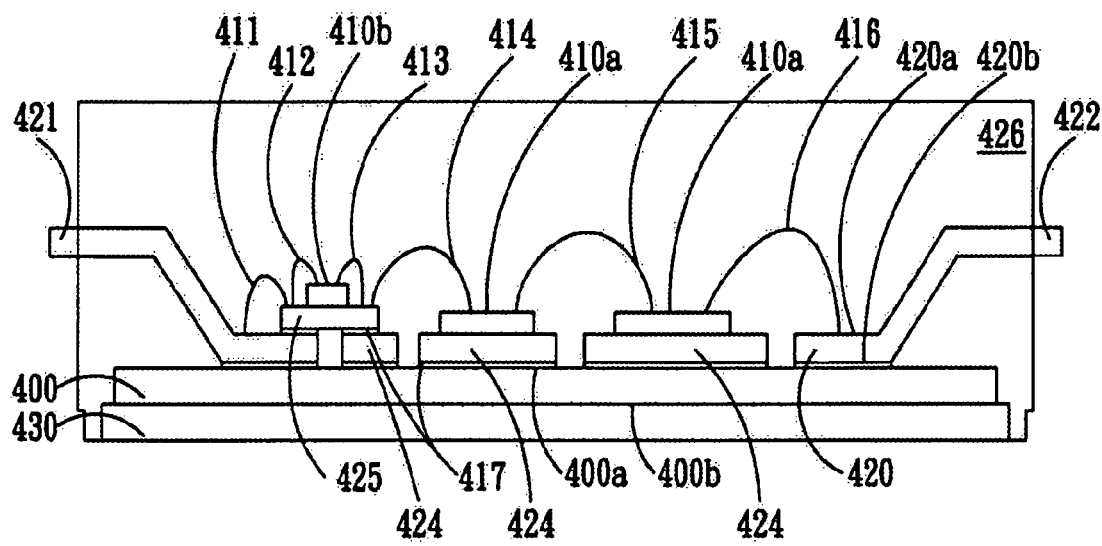
FIG. 8 is a cross-sectional diagram illustrating a power module package structure in which power elements are disposed on the high thermal conduction material in accordance with another embodiment of the present invention.

Referring to the FIG. 8, it is a cross-sectional diagram illustrating a power module package structure in accordance with another embodiment of the present invention. The package structure includes a substrate 400 with high thermal conduction and good isolation having a topside 400*a* and a backside 400*b* opposite to the topside 400*a* on the substrate 400. A lead frame 420 having a plurality of leads 421, 422 is disposed on the substrate 400 by connecting the second surface 420*b* of the lead frame 420 and the front side 400*a* of the substrate 400. Furthermore, a plurality of high thermal conduction blocks 424 are disposed on the topside 400*a* of the substrate 400. One end of the circuit plate 425 is disposed on the first surface 420*a* of the lead frame 420 in order to form a stacking structure. And another end of the circuit plate 425 is connected with the high thermal conduction block 424 which is most near the circuit plate 425. Therefore, the occupied area of the substrate is shrunk by the stacking structure, and the size of the package structure is shrunk, too. A plurality of control elements are disposed on the circuit plate 425, and a plurality of power elements on the high thermal conduction block 424 respectively. A plurality of wire bonds 411, 412, 413, 414, 415, 416, are formed to connect each elements 410*a*, 410*b* and the circuits of the circuit plate 425 and the lead frame 420 by wire bonding. Furthermore, a metal plate 430 is connected with the backside 400*b* of the substrate 400. But in another embodiment, the metal plate 430 is not necessary. Then part of the substrate, the elements, the circuit plate and lead frame are encapsulated by package material 426, but not the leads.

In the foregoing package structure illustrated in FIG. 8, the substrate 400 and the circuit plate 425 are as the same as the substrate and the circuit plate illustrated in other diagrams. A stacking structure formed by the circuit plate 425 and the lead frame 420 is disposed on the substrate 400. The occupied area of the substrate is shrunk, and the size of the package structure is shrunk because of the stacking structure.

The power elements are disposed on the high thermal conduction block 424 which are disposed on the substrate 400, and the substrate 400 is connected with the metal plate 430. An efficient way of heat transmitting is formed by this structure. Lots of heat is transmitted from the high thermal conduction block through the substrate 400 and the metal plate 430 to outside environment or heat sink. Therefore, the package structure of the present invention can bear lots of heat which is produced by the passing of lots of the electric current in short time. The high thermal conduction block 424 is a metal block.

In other embodiment, the control elements 410b can be electrical connected with the circuit plate 425 without the wire bonds. The circuit plate 425 and the lead frame 420 are electrical connected to each other by using the adhesive 417 instead of the wire bonds, for example sliver adhesive. Furthermore, the ends of the lead frame 420 can be on the same plane or on different plane like the structure of lead frame 420 illustrated in FIG. 5A to FIG. 5C.

The foregoing embodiments are the prefer embodiments but not limit. In the spirit of the present invention, the package structure can be modified and implemented, and the variations are still part of the present invention. Therefore, the scope of the present invention is defined by the claims.

What is claimed is:

1. A package structure of a power module, said package structure comprising:
   a lead frame having a first surface, a second surface opposite to said first surface, and a plurality of leads;
   a circuit plate having a topside and a backside, said topside of said circuit plate being connected with part of said second surface of said lead frame to form a stacking structure;
   a substrate having a topside and a backside, said topside surface of said substrate being connected with part of said second surface of said lead frame to form another stacking structure;
   at least one first element disposed on said first surface of said lead frame or said topside of said substrate;
   at least one second element disposed on said topside of said circuit plate; and
   a plurality of wire bonds connecting said circuit plate with said lead frame, said circuit plate with said first element, and said first element with said lead frame.

2. The package structure according to claim 1, wherein said substrate is an isolating material.

3. The package structure according to claim 2, wherein said isolating material is selected from the group consisting of a metal-composite material, a single surface metal-composite material and a dual surface metal-composite material.

4. The package structure according to claim 1, wherein said circuit plate is selected from the group consisting of a glass fiber epoxy and a ceramic material.

5. The package structure according to claim 1, wherein said first element is a power element, and said second element is a control element.

6. The package structure according to claim 1, wherein the ends of said lead frame are on the same plane.

7. The package structure according to claim 1, wherein the ends of said lead frame are on a different plane.

8. The package structure according to claim 1, wherein said circuit plate is disposed on part of said first surface of said lead frame to form said stacking structure.

9. The package structure according to claim 8, wherein said stacking structure is disposed on said structure by connecting said second surface with said topside.

10. The package structure according to claim 9, further comprising a metal plate disposed on said rear surface of said structure.

11. The package structure according to claim 1, wherein said topside of said circuit plate and said topside of said substrate are disposed on the same plane, or said backside of said circuit plate and said backside of said substrate are disposed on the same plane.

12. The package structure according to claim 11, further comprising a metal plate having a topside and a backside, said backside of said substrate and said backside of said circuit plate being disposed on said topside of said metal plate.

13. A package structure of a power module, said package structure comprising:
    a lead frame having a first surface, a second surface opposite to said first surface, and a plurality of leads;
    a circuit plate having a topside and a backside, said topside of said circuit plate being connected with part of said lead frame to form a stacking structure;
    a substrate having a topside and a backside, and part of said lead frame being disposed on said topside of said substrate with said second surface to form another stacking structure;
    at least one first element disposed on said substrate or said lead frame disposed on said substrate;
    at least one second element disposed on said topside of said circuit plate; and
    a plurality of wire bonds connecting said circuit plate with said lead frame, said circuit plate with said first element, and said first element with said lead frame.

14. The package structure according to claim 13, wherein said substrate is an isolating material.

15. The package structure according to claim 14, wherein said isolating material is selected from the group consisting of a metal-composite material, a single surface metal-composite material and a dual surface metal-composite material.

16. The package structure according to claim 13, wherein said circuit plate is selected from the group consisting of a glass fiber epoxy and a ceramic material.

17. The package structure according to claim 13, wherein said first element is a power element and said second element is a control element.

18. The package structure according to claim 13, wherein the ends of said lead frame are on the same plane.

19. The package structure according to claim 13, wherein the ends of said lead frame are on a different plane.

20. The package structure according to claim 13, further comprising a metal plate disposed on said backside of said substrate.

21. The package structure according to claim 13, wherein said circuit plate is disposed on pan of said first surface of said lead frame to form said stacking structure.

22. The package structure according to claim 21, wherein said stacking structure is disposed on said structure by connecting said second surface with said topside.

23. The package structure according to claim 13, wherein said circuit plate is disposed on part of said second surface of said lead frame to form said stacking structure.

24. The package structure according to claim 23, wherein said stacking structure is disposed on said substrate.

25. The package structure according to claim 13, further comprising at least one metal block disposed between said first elements and said substrate.

* * * * *